United States Patent [19]
Flaker et al.

[11] Patent Number: 6,133,608
[45] Date of Patent: *Oct. 17, 2000

[54] SOI-BODY SELECTIVE LINK METHOD AND APPARATUS

[75] Inventors: Roy Childs Flaker, deceased, late of Essex Junction, Vt., by Scott Flaker, Catherine O'Brien, Heather Flaker, Anne Flaker, Bruce Flaker, Shirley A. Flaker, heirs; Louis L. Hsu, Fishkill, N.Y.; Fariborz Assaderaghi, Mahopac, N.Y.; Jack A. Mandelman, Stormville, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/063,822

[22] Filed: Apr. 22, 1998

Related U.S. Application Data

[60] Provisional application No. 60/044,248, Apr. 23, 1997.

[51] Int. Cl.⁷ .................................................. H01L 29/72
[52] U.S. Cl. ...................... 257/347; 350/401; 350/502; 350/773
[58] Field of Search ............................. 257/347, 350, 257/401, 502, 773

[56] References Cited

U.S. PATENT DOCUMENTS

| | | | |
|---|---|---|---|
| 5,120,668 | 6/1992 | Hsu et al. | 437/41 |
| 5,234,535 | 8/1993 | Beyer et al. | 156/630 |
| 5,258,318 | 11/1993 | Buti et al. | 437/34 |
| 5,276,338 | 1/1994 | Beyer et al. | 257/52 |
| 5,391,510 | 2/1995 | Hsu et al. | 437/44 |
| 5,405,795 | 4/1995 | Beyer et al. | 437/41 |
| 5,466,625 | 11/1995 | Hsieh et al. | 437/52 |
| 5,484,738 | 1/1996 | Chu et al. | 437/33 |
| 5,521,399 | 5/1996 | Chu et al. | 257/36 |
| 5,528,062 | 6/1996 | Hsieh et al. | 257/298 |
| 5,567,533 | 10/1996 | Hsu et al. | 430/5 |
| 5,573,964 | 11/1996 | Hsu et al. | 437/40 |
| 5,599,725 | 2/1997 | Dorleans et al. | 437/40 |
| 5,622,881 | 4/1997 | Acocella et al. | 438/264 |
| 5,633,522 | 5/1997 | Dorleans et al. | 257/344 |
| 5,643,813 | 7/1997 | Acocella et al. | 437/43 |
| 5,663,578 | 9/1997 | Hsu et al. | 257/66 |
| 5,675,164 | 10/1997 | Brunner et al. | 257/331 |
| 5,689,127 | 11/1997 | Chu et al. | 257/329 |
| 5,729,039 | 3/1998 | Beyer et al. | 257/347 |
| 5,736,891 | 4/1998 | Buti et al. | 327/434 |
| 5,753,525 | 5/1998 | Hsu et al. | 437/43 |
| 5,759,907 | 6/1998 | Assaderaghi et al. | 438/386 |
| 5,767,549 | 6/1998 | Chen et al. | 257/347 |

*Primary Examiner*—Edward Wojciechowicz

[57] ABSTRACT

A silicon-on-insulator (SOI) structure and method of making the same includes an SOI wafer having a silicon layer of an original thickness dimension formed upon an isolation oxidation layer. At least two p-type bodies of at least two SOI field effect transistors (PFETs) are formed in the silicon layer. At least two n-type bodies of at least two SOI field effect transistors (NFETs) are also formed in the silicon layer. Lastly, an SOI body link is formed in the silicon layer of the SOI wafer adjacent the isolation oxidation layer for selectively connecting desired bodies of either the p-type SOI FETs or the n-type SOI FETs and for allowing the connected bodies to float.

17 Claims, 12 Drawing Sheets

SOI-BODY SELECTIVE LINK METHOD AND APPARATUS

This application claims priority from Provisional application Ser. No. 60/044,248 filed on Apr. 23, 1997.

BACKGROUND OF THE INVENTION

This invention relates generally to silicon-on-insulator (SOI) devices and, more particularly, to an SOI body having a selective equilibration link.

An electric potential of a floating silicon-on-insulator (SOI) body depends upon its present bias state and also on its history. An alpha particle hit to the SOI body can also significantly alter the body-charge state. Consequently, it may be impossible to maintain closely matched threshold voltages (Vts) in circuits requiring the condition of closely matched Vts. Since the potential of a floating SOI body depends on its present bias state and also on its history, circuits such as latch type sense amplifiers of any memory cell. A latch type sense amplifier may experience serious Vt mismatch, which adversely affects a performance of the circuit. For example, for a sense latch requiring closely matched Vts in the cross-coupled devices, due to the dependence of body charging on device state, Vt mismatches up to 300 mV are likely to occur. The uncontrollable Vt mismatch degrades the ability of the sense amplifier to detect small signals. For SRAM cells, alpha particle induced Vt mismatch has been observed to disturb an SOI body more than bulk CMOS designs.

To illustrate the problem of Vt mismatch, let us now refer to FIGS. 1A–1C in which a cross-coupled NFET pair 10 of a sense amplifier is shown at various times or phases of operations. During a "latched phase", the body of the device 12 on the left (condition 1, Vg=0 V, Vd=2.0 V, Vs=0 V) will charge with holes as a result of impact ionization and thermal generation (FIG. 1A). Full body charging typically occurs within 10–20 ns. The device 14 on the right (condition 2, Vg=2.0 V, Vd=Vs=0 V) will have the body in a maximally depleted condition of (minimum) holes. Since the cross-coupled NFETs 10 may sit (i.e., remain) in these states for times much longer than 20 ns, a significant difference in body charge and potential is developed. FIG. 2 shows hole concentration contours for the device 12 of FIG. 1A in condition 1, as modeled using a device simulation/modeling tool, as is known in the art. Note that the maximum hole concentration is greater than $1 \times 10^{17}$, which in this instance is approximately equal to the background doping concentration. On the other hand, the device 14 of FIG. 1A in condition 2 (referring now to FIG. 3) is essentially fully depleted. The peak hole concentration is approximately $1 \times 10^{12}$, which is negligible relative to the background doping concentration. The restore phase (FIG. 1B) does not last long enough for the body charge to equilibrate to equal values, although the electrical bias is equal on each device. Typically, it takes hundreds of milliseconds for equilibration to occur, since hole charge decreases by recombination and current through the source; both are very slow processes in comparison with the setting of a sense amplifier for a sensing operation. Once a new setting phase (FIG. 1C) is entered (also referred to as a triggering and/or activating of the sense amplifier), the devices still have a maximum body-charge mismatch condition and have different threshold voltages. A body-charge mismatch resulting from the latched phase results in a Vt mismatch during the setting phase. As shown, body 14 of FIG. 1C experiences a transition in source voltage from 2.0 volts to 1.0 volt. FIG. 4 is a comparison of modeled Id-Vs characteristics during the setting phase for the devices 12, 14 in condition 1 and condition 2, respectively, as shown in FIG. 1C after the restore phase. Note that an apparent Vt mismatch of approximately 135 mV exists for this example, which detracts from the ability to sense small signals on the order of 8–250 mV of the sense amplifier of an SOI memory cell.

In another example, consider the schematic of a typical latch type sense amplifier 20, such as shown in FIG. 5. The procedure for reading from a cell 22 shall now be briefly described. First, the bit lines, BLC (Complement bit-line) and BLT (True bit-line), are precharged by a sense amplifier reset/restore signal (SMPRST), used to charge both bit lines to a certain level prior to a read/write operation. The cell 22 may then be read by activating its wordline (WL), which develops a small offset voltage between the paired bitlines BLC and BLT. After a predetermined delay, a set signal (SET) is activated and the cross-coupled inverters (N1/P1, N2/P2) latch the signal (i.e., the two inverters latch a particular state and then remain in that state). Finally, the "0" and "1" signals are sent out through data out drivers (not shown) connected to the bitlines.

The delay of the set signal (SET) is critical for proper setting of the latch and for sense amplifier performance. If the sense amplifier 20 is set too early, erroneous data could be received as a result of insufficient time for allowing the data to propagate through the longest path of the data through the SRAM device. However, if the set pulse occurs too late, the cost is extra delay added to the read cycle of the SRAM device. Normally, for today's SRAMs, the set signal is fired when the bitline offset voltage reaches about 150 mV.

For SOI devices, since all the bodies are floating, the initial body potential can range from near ground to near Vdd (when considering both NFETs and PFETs whose source may not necessarily be grounded or tied to Vdd). As referred to herein above, this produces a large Vt mismatch. This mismatch can slow down sensing (i.e., a slower set pulse is required) or it results in a complete failure to set the latch in a proper direction.

Circuit simulations of SOI devices have been performed for initial body potential mismatches up to 700 mV using a suitable circuit simulation tool, as is known in the art. Referring now to FIG. 6, a simulation of sense amplifier operating margin is shown. Curve A shows a required bitline offset voltage for reliable sensing as a function of body potential mismatch for separate, non-linked adjacent NFET bodies. In this instance, the set signal must be delayed by approximately a factor of three (3) relative to invoking the set pulse at a bitline offset of 100 mV. Simulations have also shown that if the set signal is triggered at a 150 mV bitline differential, only 400 mV or less of body potential mismatch can be tolerated. Any body potential mismatch above 400 mV cannot be tolerated.

The role of alpha particles and impact ionization generated charge shall now be discussed. It has been observed that alpha particle radiation results in significantly increased soft error rate (SER—corresponding to an error rate resulting from alpha particle bombardment) for SOI type SRAM cells relative to cells fabricated in bulk CMOS, especially with an applied voltage greater than 1.75 V (see FIG. 7). SOI has inferior SER immunity relative to bulk silicon devices at voltages greater than 1.75 V due to floating-body bipolar amplification of impact ionization charge initiated by the alpha particle hit. Note, however, at lower voltages, amplification of impact ionization generated charge in SOI is less of a factor and SOI is superior at lower voltages to bulk because of its smaller capture cross-section. In other words, at low voltages SOI is superior because of reduced significance of impact ionization and smaller capture cross-section. The soft error fails (i.e., failures) are amplified also by Vt mismatch caused by uneven (i.e., non-uniform) body charge generation of a cross-coupled latched sense amplifier. It is thus desirable to provide a method and apparatus to enhance SOI body potential equilibrium of alpha particle generated charge under certain operating conditions and to minimize Vt mismatch caused by alpha particle generated charge.

The local sense amplifier Vt mismatch problem of a floating SOI body has not yet been recognized in the art. However, floating body problems in general have been addressed with various solutions, which includes addressing floating body problems by providing body contacts. Body contacts include the tying of a floating body of an SOI device (i.e., to tie the floating body), such as a "body-tied-to-source" or discrete body contact. A discrete boding contact is used to make a contact to the body of the SOI device and tie, for example, in the case of a PFET, the PFET's body to Vdd, and in the case of an NFET, the NFET's body to ground. Note that once the body is tied, it is not floating anymore and thus any performance enhancement due to SOI body floating no longer exists. In addition, the "body-tied-to-source" or discrete body contact approach occupy a significant amount of silicon real estate. Since the various known solutions attach the body to a fixed potential, the dynamic Vt lowering advantage is lost, resulting in a serious performance penalty.

Another method, which partially alleviates the problem caused in conjunction with alpha particle radiation is to dope the channel of the SOI MOSFET with an impurity (e.g., gold) which shortens carrier lifetime, thus promoting equilibration of body charge. This method, however, seriously degrades the mobility and static leakage of the SOI MOSFET device and only provides very marginal improvement.

It is thus desirable to provide a methodology, structure and process for forming SOI body links, selectively between desired devices, which assure rapid equilibrium of body potential and closely matched Vts in critical SOI circuits.

SUMMARY OF THE INVENTION

It is an object of the present invention to overcome the problems in the art as discussed herein.

In accordance with the present invention, a silicon-on-insulator (SOI) structure and method of making the same includes an SOI wafer having a silicon layer of an original thickness dimension formed upon an isolation oxidation layer. At least two p-type bodies of at least two SOI field effect transistors (NFETs) are formed in the silicon layer. At least two n-type bodies of at least two SOI field effect transistors (PFETs) are also formed in the silicon layer. Lastly, an SOI body link is formed in the silicon layer of the SOI wafer adjacent the isolation oxidation layer for selectively connecting desired bodies of either the p-type SOI FETs or the n-type SOI FETs and for allowing the connected bodies to float. The SOI body selective link includes a desired thickness dimension and furthermore, a shallow trench isolation region is formed on a top surface thereof. The thickness dimension of the SOI body selective link and a thickness dimension of the shallow trench isolation region together are on the order of the original thickness dimension of the silicon layer of the SOI wafer. The SOI body selective link thus enables any threshold voltage mismatch in two cross-coupled SOI FETs caused by any possibility of different body potential to be eliminated and a behavior of the two cross-coupled SOI FETs to be well controlled.

The present invention provides a method and apparatus which is highly effective, without degrading the characteristics of the floating SOI body device. The present invention further imposes no area penalty, i.e., with respect to the silicon real estate of the device. Finally, the present invention preserves the inherent dynamic Vt lowering effect in floating body SOI circuits, which provides a great performance advantage over prior implementations.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

In accordance with the present invention, the bodies of selected SOI devices of an SRAM cell are linked. For example, the bodies of two cross-coupled NFET drivers and/or the two cross-coupled PFET drivers in a sense amplifier or SRAM cell may be linked. This results in a rapid equilibration, on the order of much less than 1 ns (<<1 ns), of body charge differentials due to thermal, impact ionization, alpha particle or other generation mechanisms.

Figure 8:
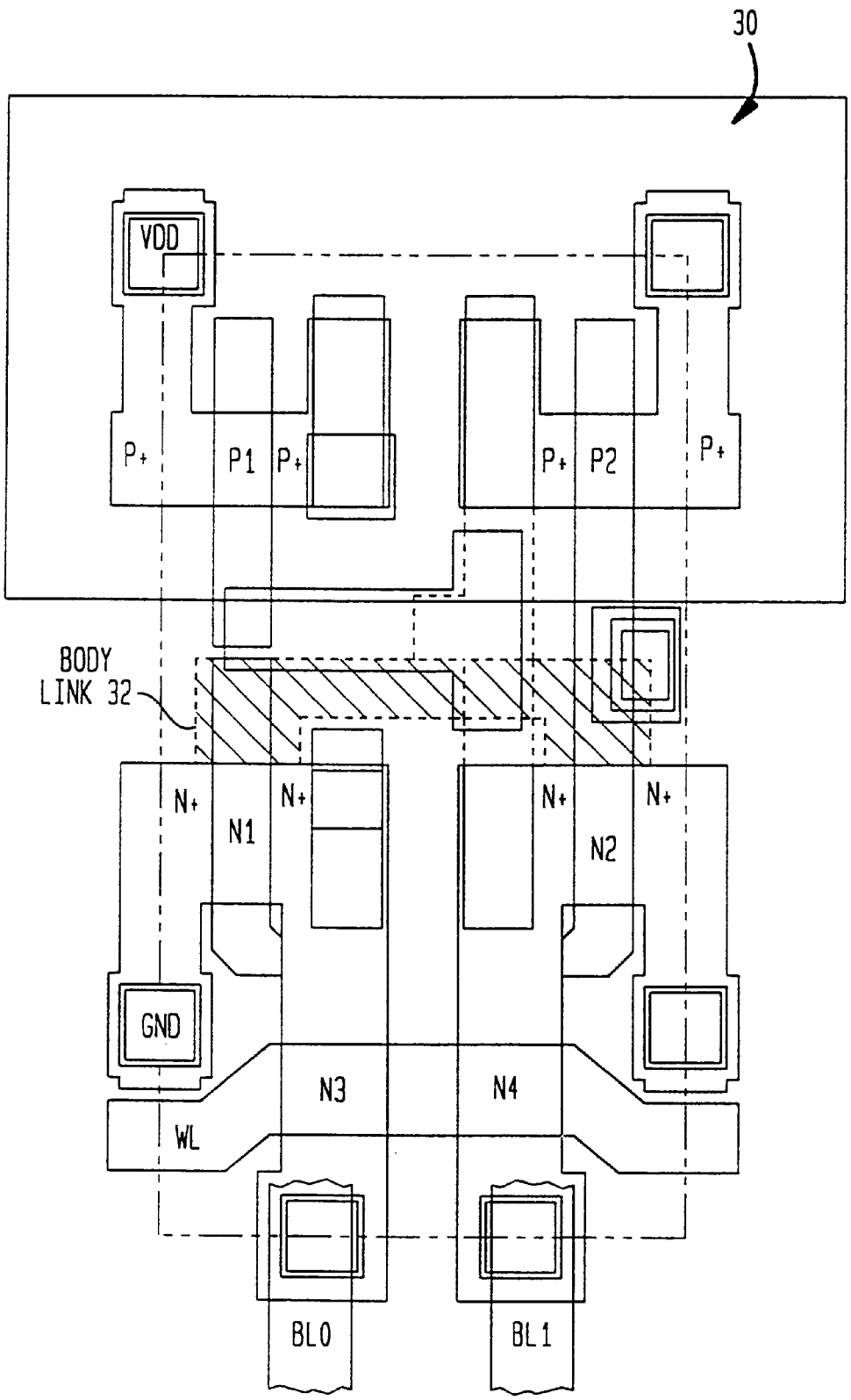
FIG. 8 illustrates a layout of an SRAM cell whose cross-coupled NFET drivers have bodies which have been selectively linked in accordance with the present invention.
Figure 9:
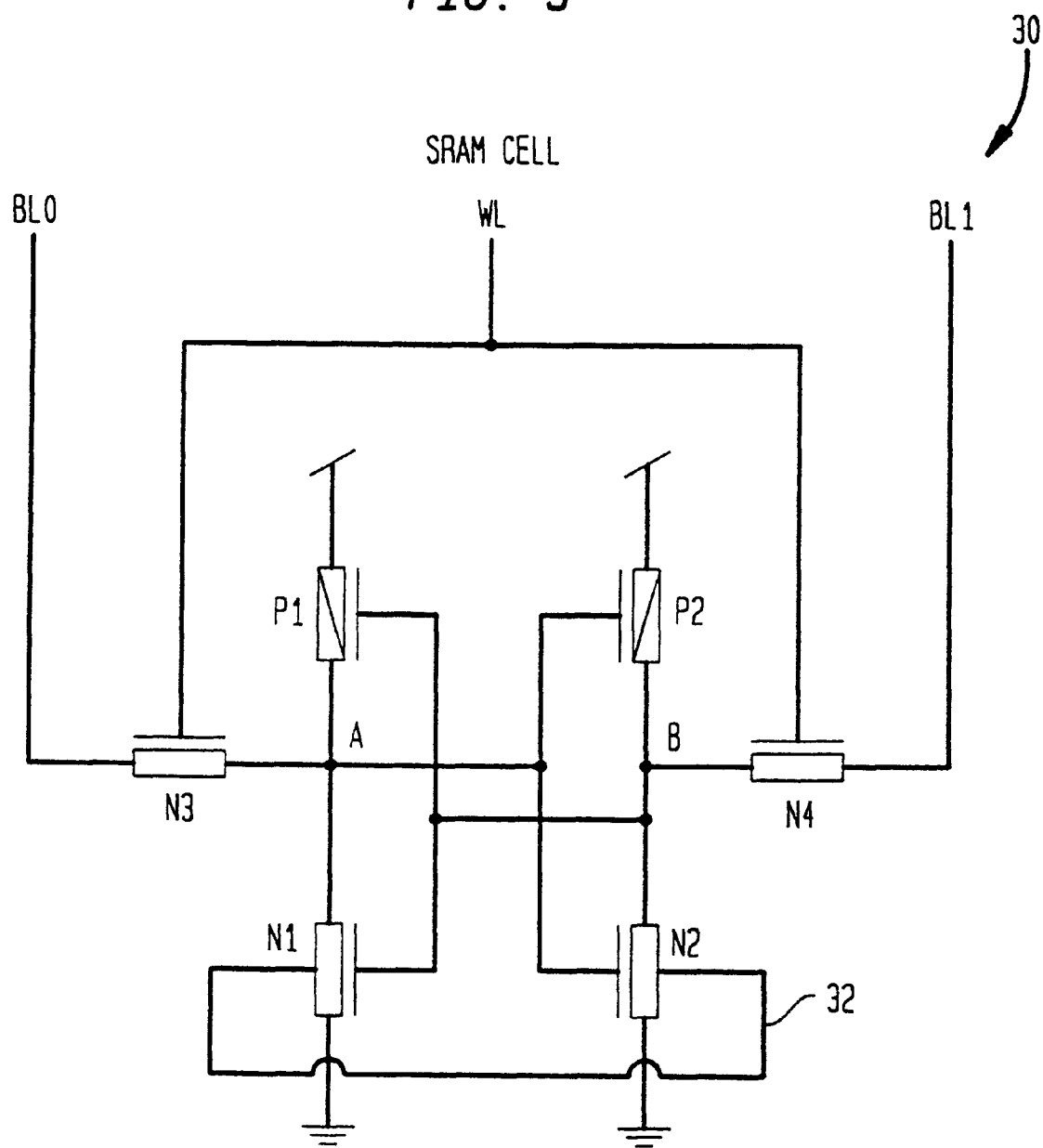
FIG. 9 is a schematic diagram of the SRAM cell, showing selectively linked NFET bodies, corresponding to the layout of FIG. 8.

The body link may include providing a selective conductive bridge (for example, a silicon bridge)between the two SOI bodies. The layout of an SRAM cell 30, as shown in FIG. 8, shows how a conductive link 32 (shown by the dotted line) may join the bodies of the two cross-coupled NFET drivers N1, N2 in the SRAM cell 30. The body link 32 region contains a shallow trench isolation (STI) oxide, thus shallow source/drain (S/D) implants during formation of the NFETs N1, N2 will not undesirably dope the selective body link 32 region or areas. FIG. 9 shows a schematic of the SRAM cell 30 corresponding to the layout shown in FIG. 8. In particular, FIG. 9 shows the linked NFET bodies via conductive link 32 in accordance with the present invention.

By linking the bodies of pairs of devices, much of the performance advantage of SOI relative to bulk CMOS is maintained (e.g., dynamic Vt lowering). On the other hand, if all bodies were tied together, the charge state of any one device would not significantly affect the body potential. In addition, in the instance if all bodies were tied together, performance would approach a performance of bulk devices (except for reduced junction capacitance).

Figure 1A:
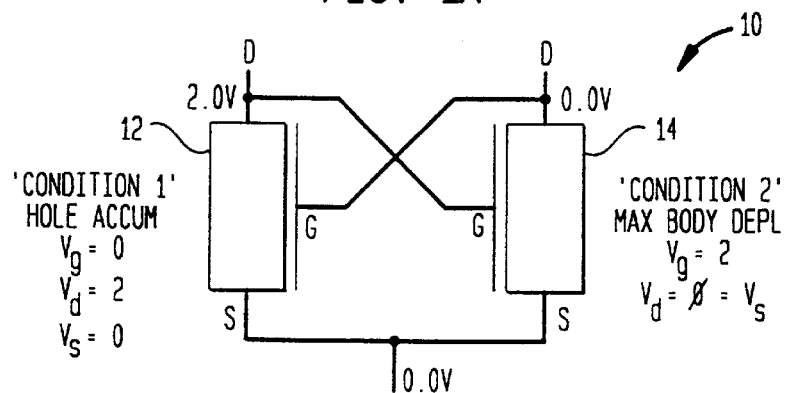
FIGS. 1A–1C show cross-coupled NFETs of an SRAM cell at various phases corresponding to a latched phase, a restored phase, and a setting phase, respectively.
Figure 1B:
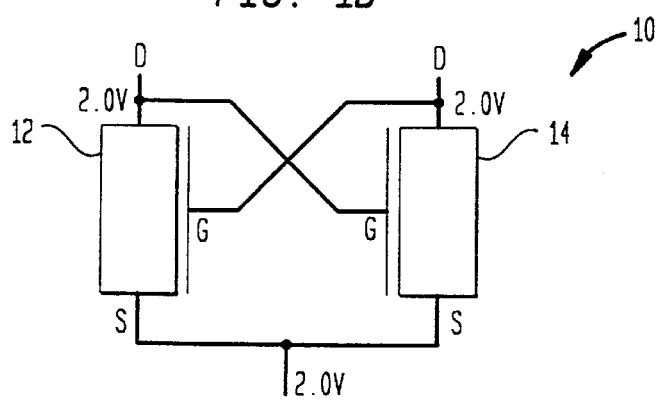
Figure 1C:
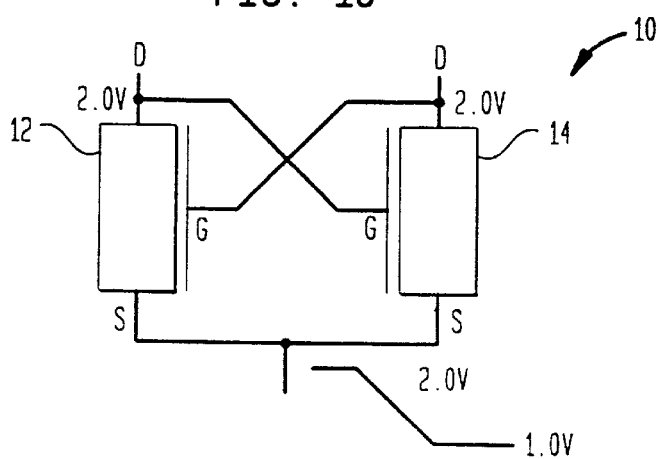
Figure 2:
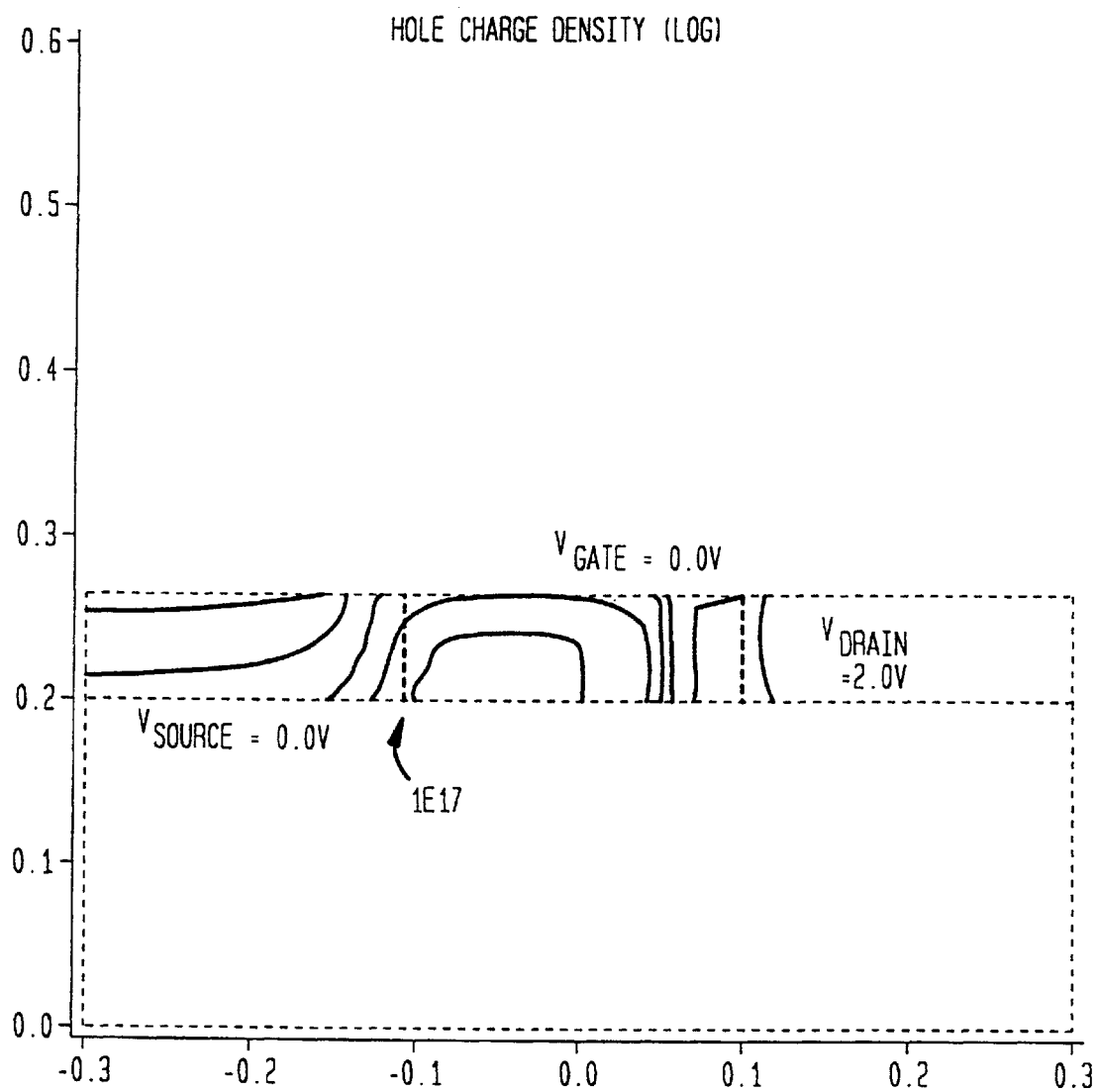
FIG. 2 shows a modeled hole contour in the body of the device in condition "1" of FIG. 1A during the latched phase.
Figure 3:
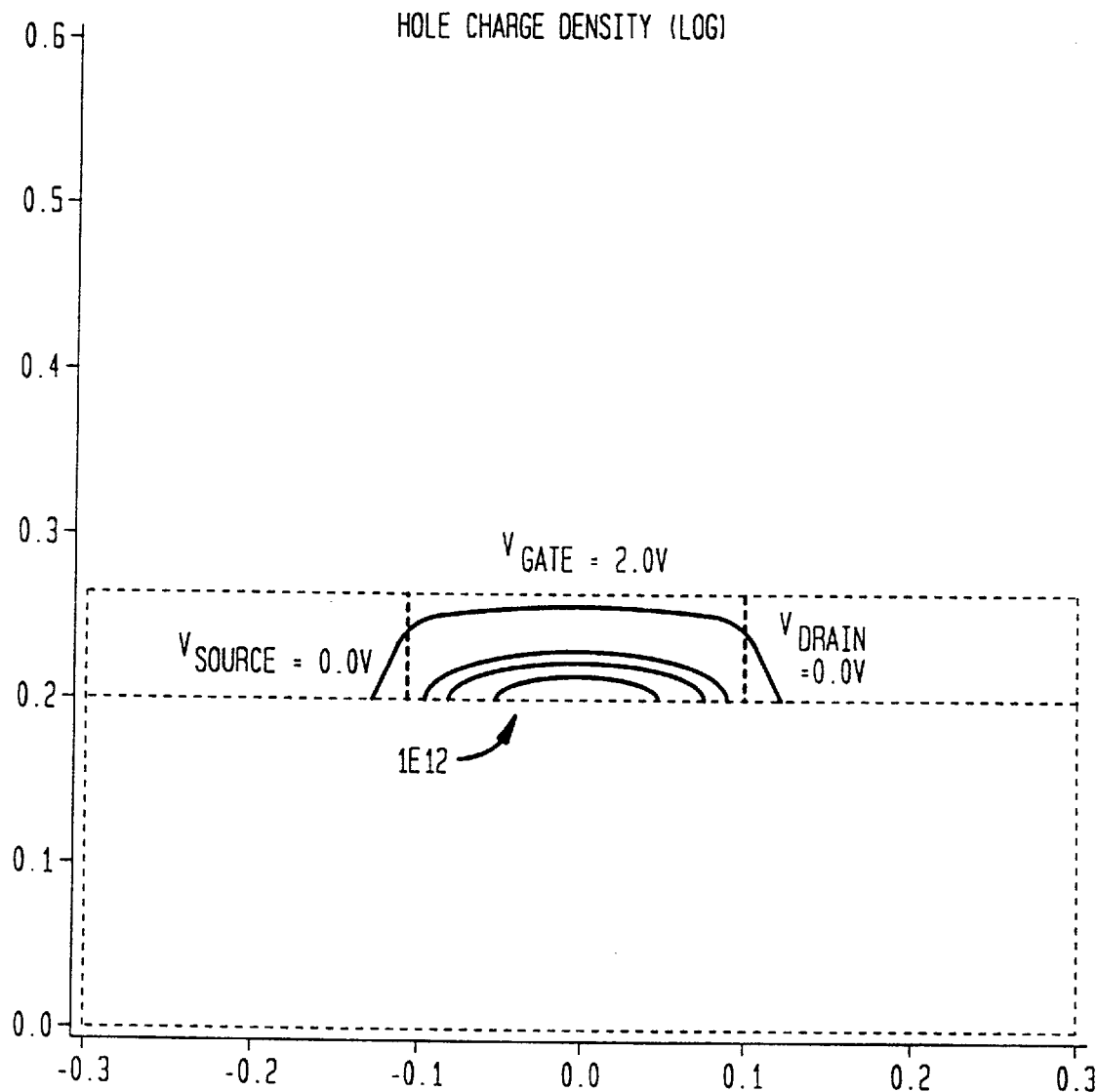
FIG. 3 shows a modeled hole contour in the body of the device in condition "2" of FIG. 1A during the latched phase.
Figure 4:
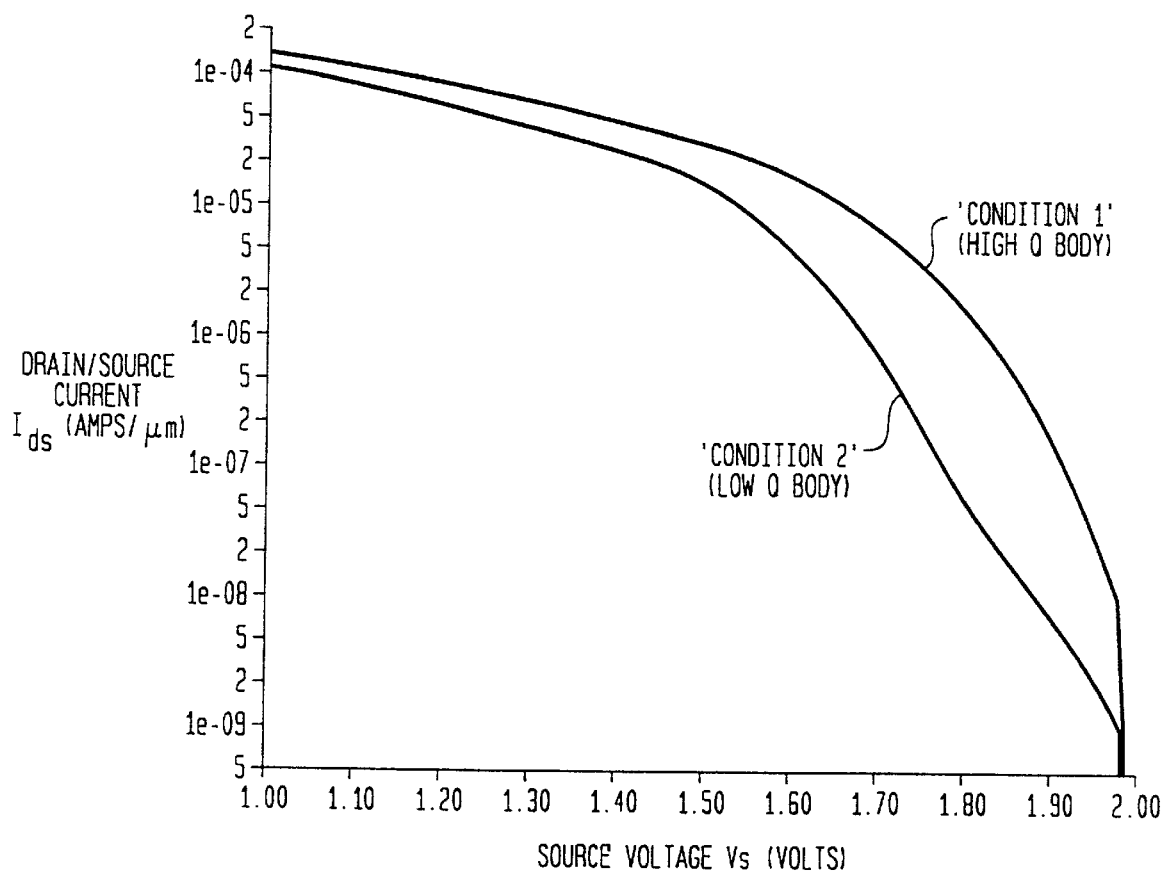
FIG. 4 is a plot of Id-Vs characteristics during the setting phase of FIG. 1C and illustrative of device mismatch.
Figure 5:
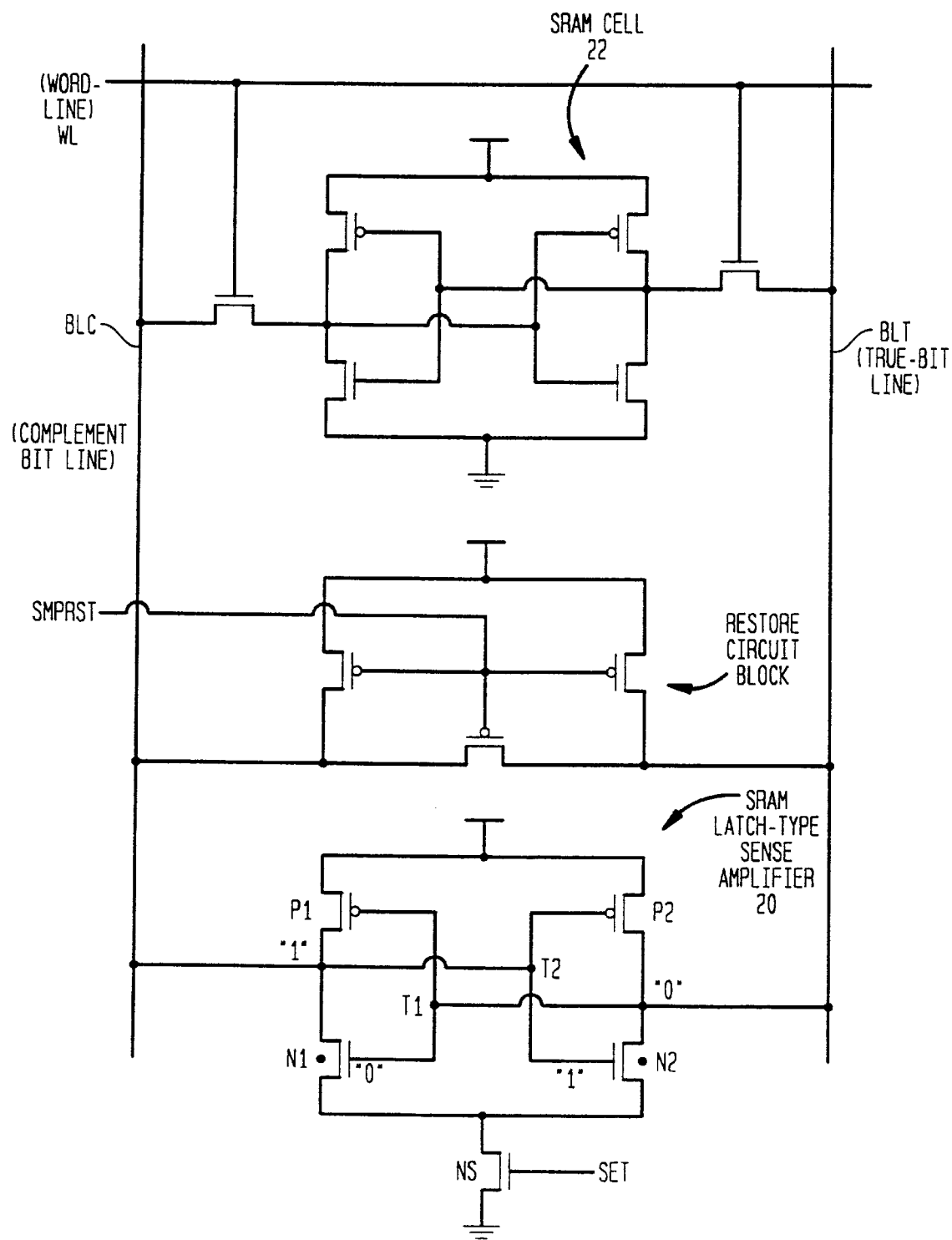
FIG. 5 is a schematic of a typical latch type sense amplifier coupled with an SRAM cell.
Figure 6:
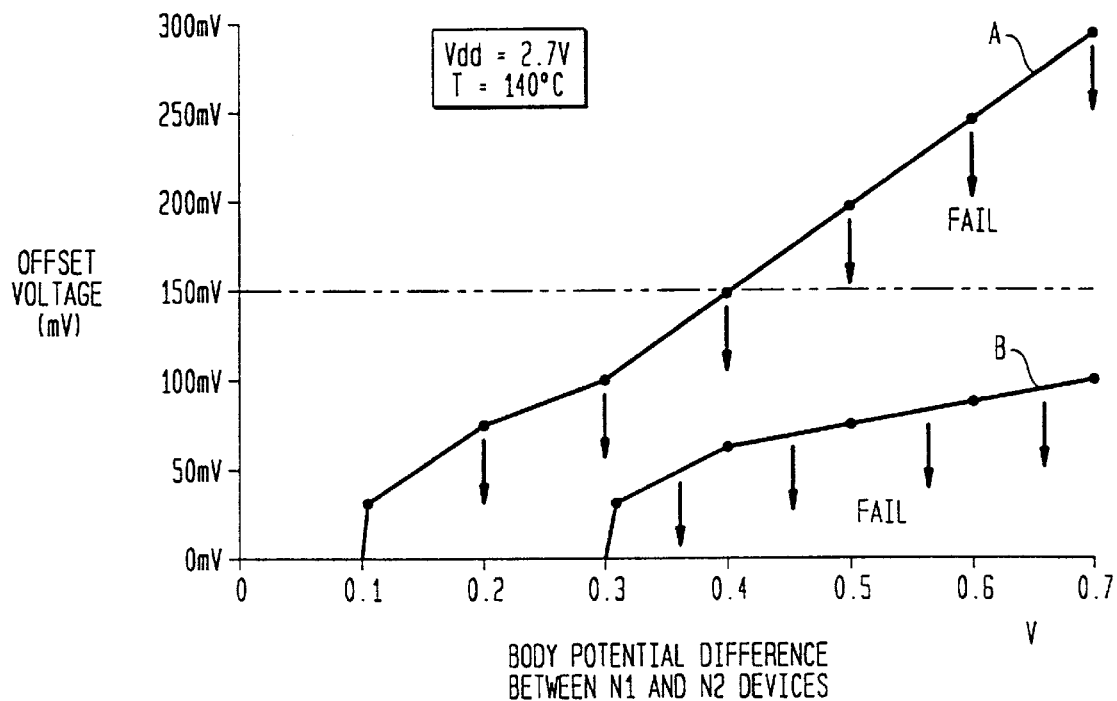
FIG. 6 is illustrative of a plot of offset voltage potential vs. body potential difference between N1 and N2 devices of FIG. 5 for a comparison of floating body operation (non-linked) to linked body operation in accordance with the present invention as determined by a simulation of the sense amplifier operating margin.
Figure 7:
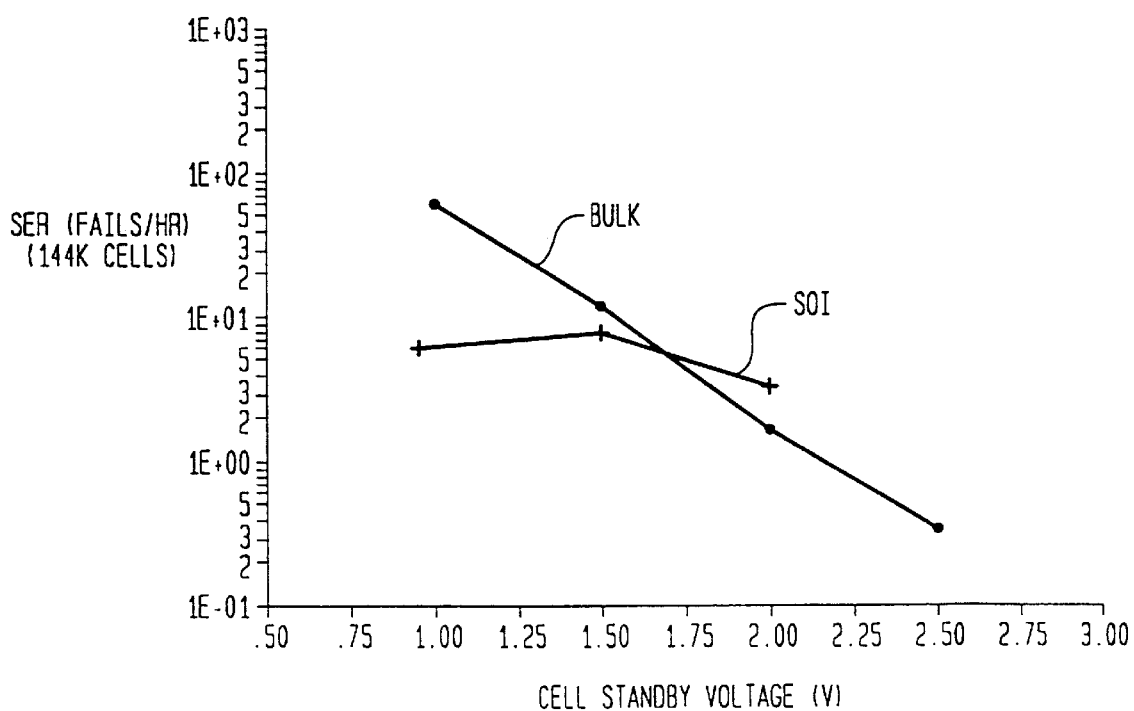
FIG. 7 is illustrative of an effect of alpha particle radiation on soft error rate of SRAM cells comparing SOI and bulk CMOS.

Referring once again to FIG. 6, a circuit simulation of sense amplifier operating margin having body potential mismatches up to 700 mV is shown. With respect to the present invention (Curve B), even with an unrealistically high resistance equilibration body link between bodies of adjacent NFETs (10M-ohms), set pulse triggering at 150 mV results in reliable sensing for initial body potential mismatches up to 700 mV. Simulations have further shown that even a high resistance link provides rapid body charge equilibration.

In the past, attempts have been made to address the problem of history dependent body charge state and Vt by contacting the body of critical devices (as opposed to linking as further discussed herein with respect to the present invention). The prior approach of contacting the body of critical devices however is not practical for sense amplifiers or SRAM cells, since body contacts impose an area penalty which may make on-pitch sense amp and dense SRAM array layouts impossible to achieve. Furthermore, solutions using body contacts greatly reduce the SOI performance advantage due to dynamic Vt lowering, since the body is tied to a fixed potential. The solution proposed herein in accordance with the present invention advantageously avoids the area and performance penalties.

The method and apparatus in accordance with the present invention also allow for the linked bodies to be contacted, if desired, for the purpose of using the body as an additional control element. Use of the body as a control element allows the sources of the NFETs to be tied to ground while controlling a setting thereof with circuitry connected to the body.

Figure 10A:
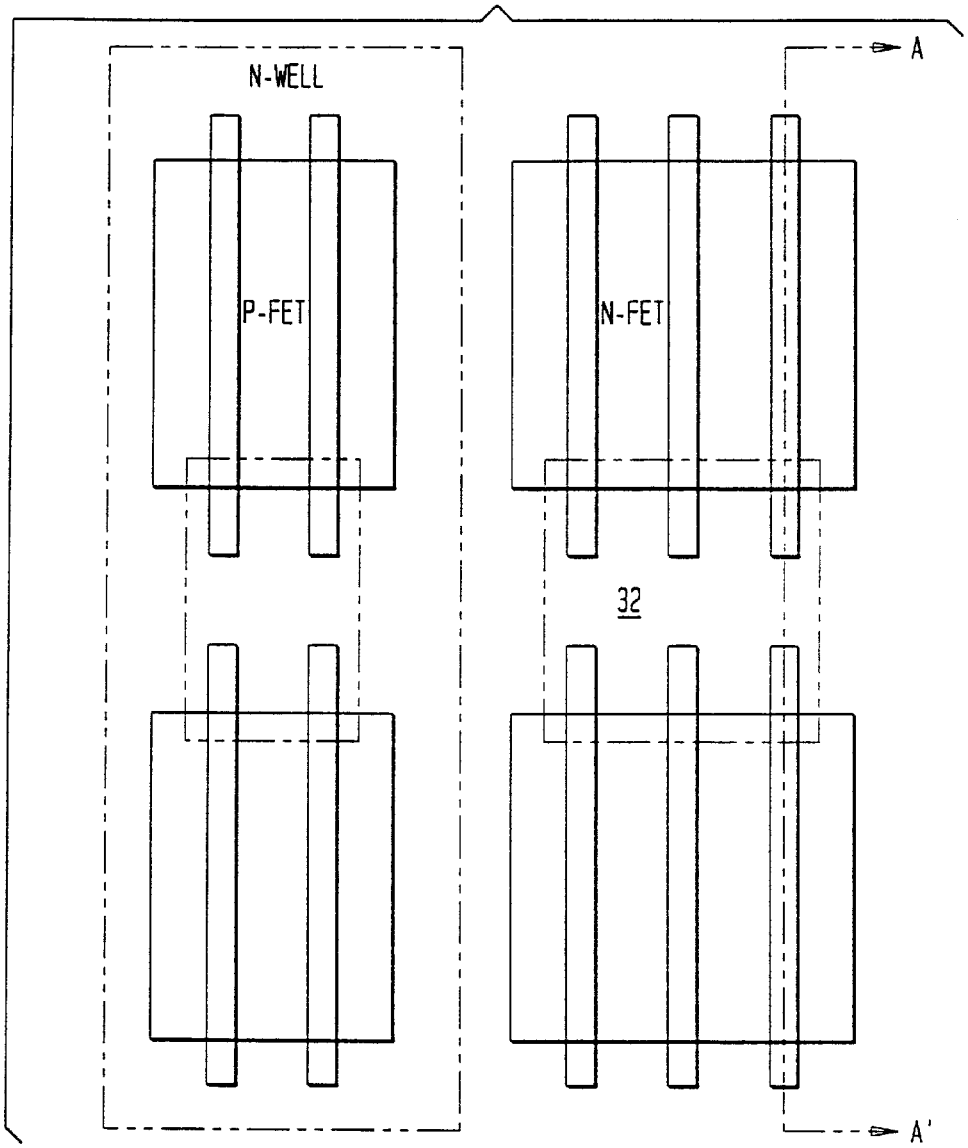
FIGS. 10A and 10B show a top view layout and a cross-sectional view (after gate patterning) for illustrating the principle of the body link in accordance with the present invention.
Figure 10B:
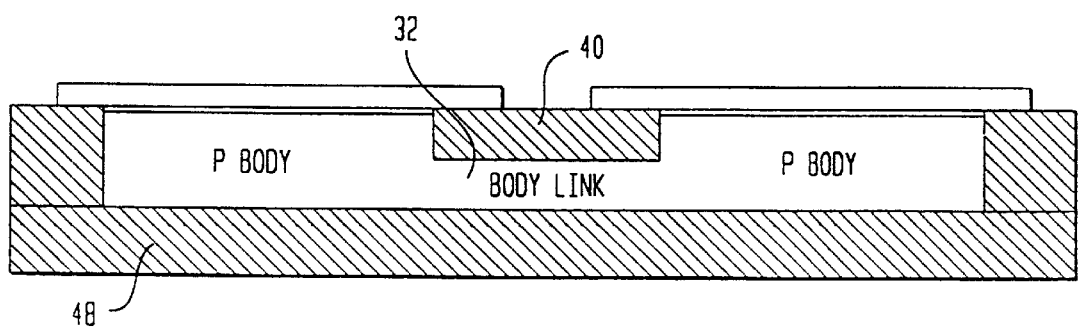

The structure and process in accordance with the present invention for forming SOI body selective equilibration links shall now be described with reference to FIGS. 10A and 10B. Referring now to FIG. 10A, a top view layout(after gate patterning) of the body link 32 is shown. FIG. 10B illustrates a cross-sectional view (after gate patterning) of the body link 32. The conductive link 32 consists of a thinned section of SOI containing oxide isolation 40 over the link 32. That is, the isolation oxide 40 is formed above the silicon body link 32. The recessed silicon of link 32 and oxide isolation 40 in the body link area advantageously assures a resistance to punch through between adjacent diffusions.

Figure 11:
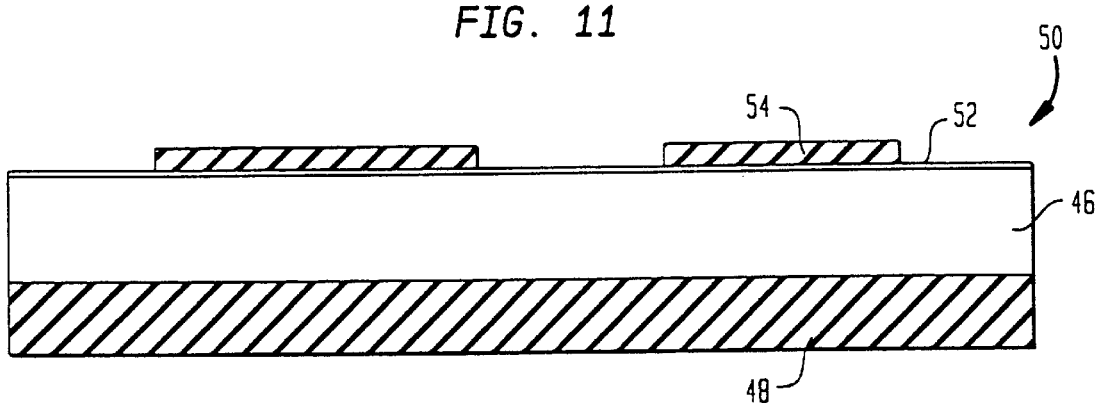
FIGS. 11–20 illustrate a structure having SOI-body selective links and various process steps in the fabrication of SOI-body selective links in accordance with the present invention.
Figure 12:
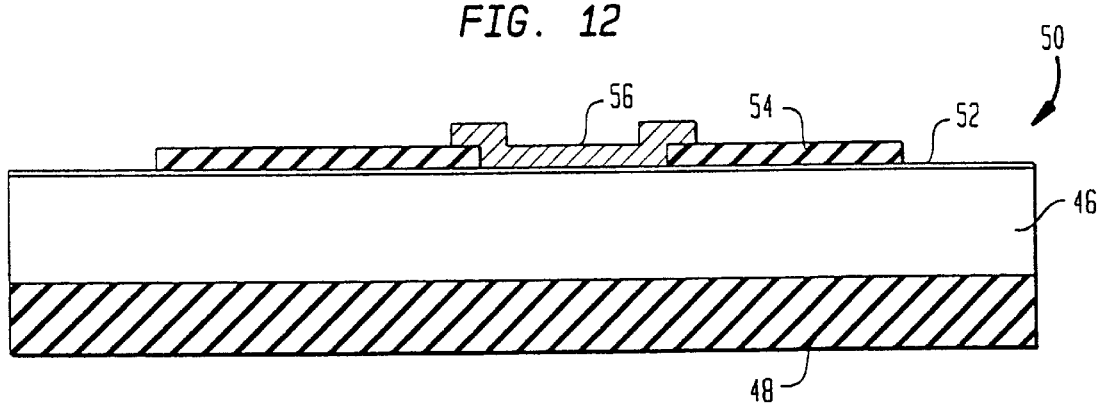
Figure 13:
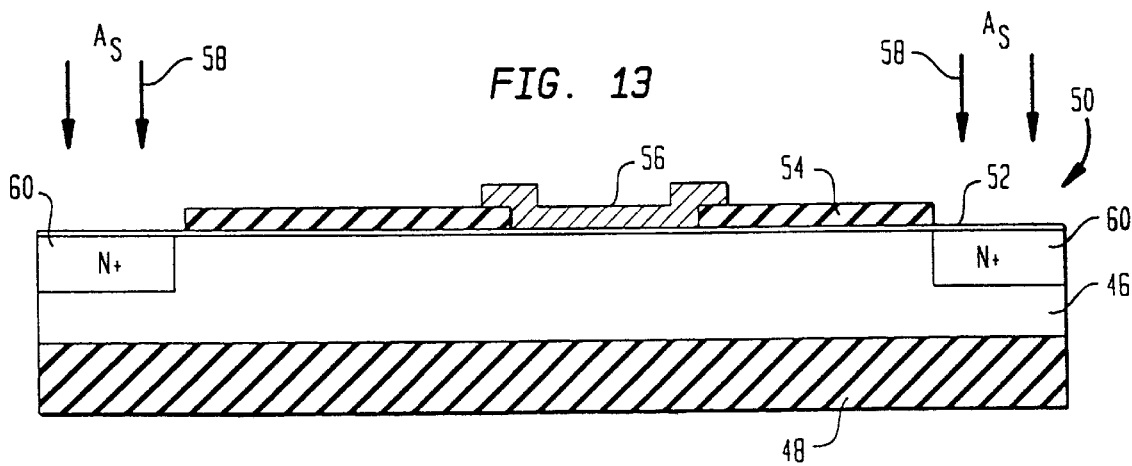
Figure 14:
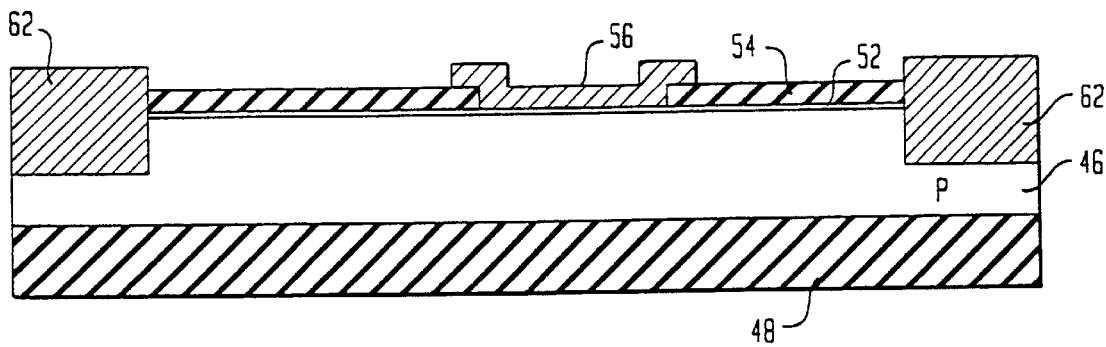

In FIG. 11, the process begins with an SOI wafer 50 (including a silicon layer 46 over an oxide isolation 48) having a pad oxide layer 52 and a patterned pad nitride layer 54. The pad oxide layer 52 is necessary for depositing the nitride layer 54, since nitride can not be directly deposited upon silicon. A chemical vapor deposition (CVD) oxide layer is then deposited and patterned such that the CVD oxide 56 remains only where it is desired to form a selective equilibration body link (FIG. 12). A shallow N+ (As) implant 58 is then made into the areas 60 not protected by the nitride pad or the CVD oxide (FIG. 13). The structure then goes through a high-pressure, low-temperature oxidation (HIPOX) cycle. The N+ regions 60 (formed in FIG. 13) oxidize without appreciable diffusion to form HIPOX regions 62. That is, oxidation proceeds rapidly through the N+ regions, then slows dramatically in the P-type silicon, without significant As dopant outdiffusion. Experiments have shown that a 700° C., HIPOX oxidation can result in the N+ layer oxidizing greater than five (5) times faster than the underlying P-type silicon. This allows very precise control of the oxidation depth, since the oxidation rate will slow markedly when the shallow N+ region is consumed (FIG. 14). This step and the particular type of control is critical for assuring that body links will have good continuity yield.

Figure 15:
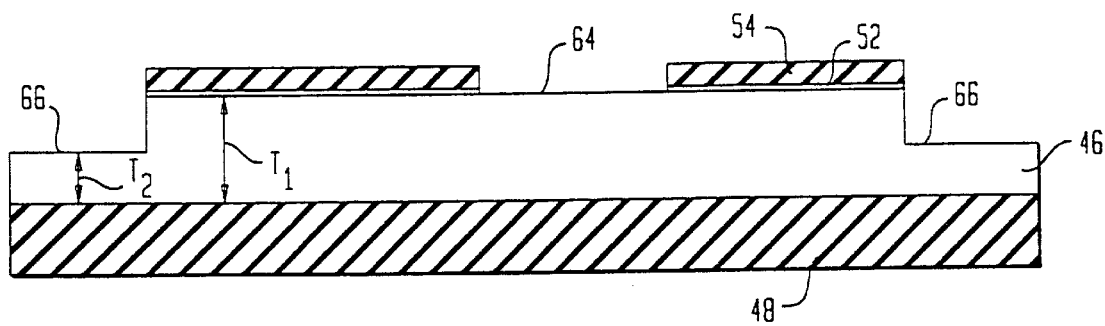

The oxide areas 62 are then etched out with an isotropic etch, such as a wet etch in buffered HF, vapor HF etch, chemical dry etch (CDE), as are known in the art, leaving exposed and recessed silicon regions 64 and 66, respectively (FIG. 15).

Alternatively to the steps as discussed above with respect to FIGS. 14 and 15, the N+ implanted regions 60 of FIG. 13 may be etched selectively to the P-type silicon with an etch such as HF/HNO3/CH3COOH (in a ratio of 1/3/8). This avoids the oxidation step, and possibly reduces any silicon dislocations.

Figure 16:
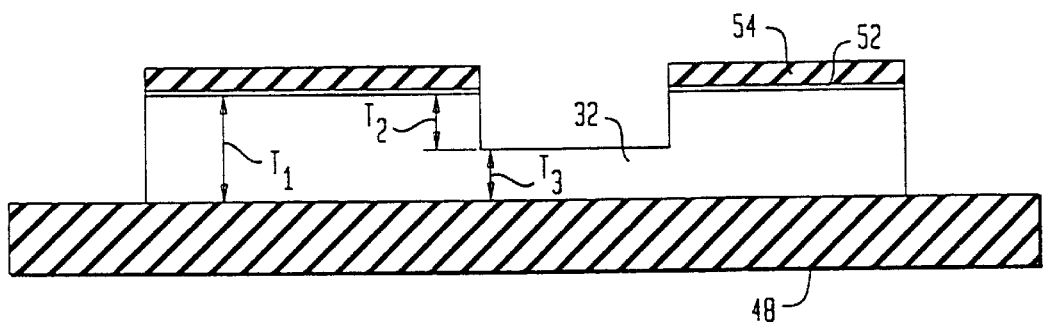
Figure 17:
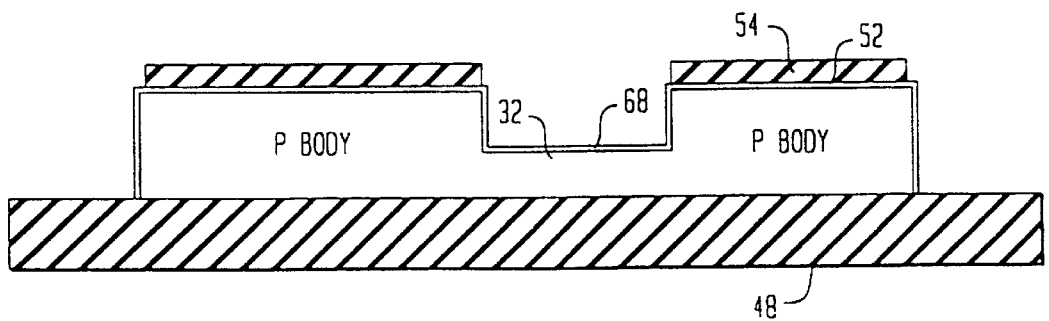
Figure 18:
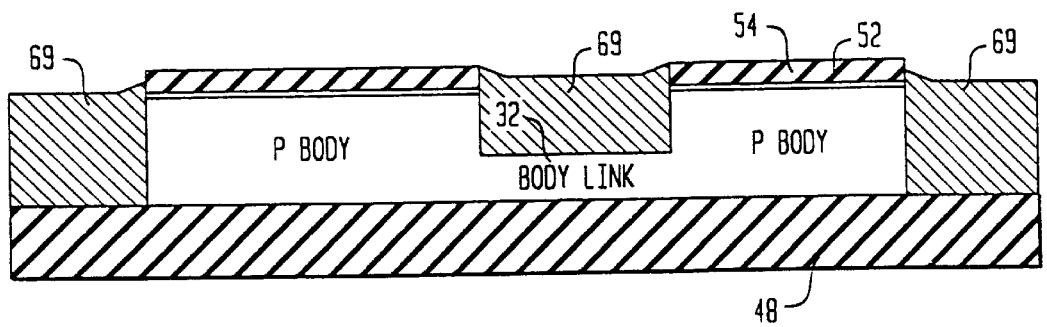
Figure 19:
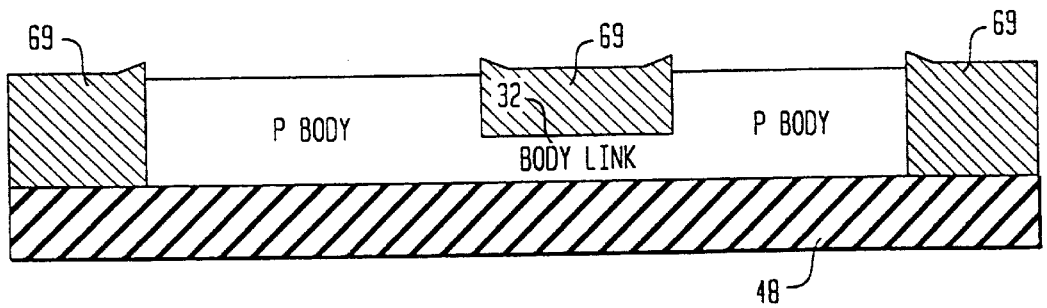
Figure 20:
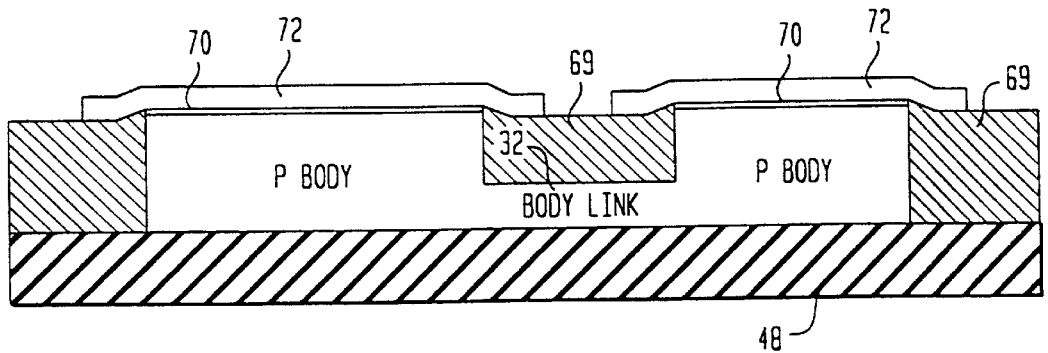

Referring now to FIG. 16, an anisotropic etch is then used to etch the silicon in the exposed regions 64 and 66. The etch continues until the silicon in the thinned areas is etched to the back oxide. This results in the creation of a silicon body link 32 in an area which contained the full SOI silicon thickness $T_1$ before the anisotropic etch. In FIG. 17, a normal shallow trench isolation (STI) oxide 68 (corresponding to an active area oxidation) is then grown. The shallow trench 68 and other trench areas are then filled with tetra ethyl ortho silicate (TEOS) 69 and planarized to the top of the pad nitride 54 (FIG. 18). The pad nitride 54 and underlying pad oxide 52 are then removed (FIG. 19). A gate oxide 70 is thereafter grown, followed by deposition and patterning of a gate conductor 72 (FIG. 20). Thereafter, normal processing for the local interconnections and back-end-of-line (BEOL) continues in accordance with known fabrication techniques for the fabrication of the desired SRAM device.

While the SOI-body selective link according to the invention has been shown and described as an equilibration link, the SOI-body selective link may equally be implemented as an alternative link. For example, the SOI-body selective link may be utilized in a logic circuit having selected SOI bodies thereof linked together such that circuit timing is not adversely affected by body potential variation. The particular linked bodies would include those bodies of critical devices on a critical path of the logic circuit for which any Vt change would undesirably affect a timing of the logic circuit. Such critical devices may include those for sensing a rising signal transition or a falling signal transition and which further issue a timing control signal therefrom. In addition, while the invention has been shown and described as using silicon for the conductive material of the selective link, it is to be understood that such conductive material may include any suitable conductive material such as metal, tungsten, silicide, etc., as appropriate and/or suitable for a particular SOI memory circuit application.

The present invention thus provides a structure and a method for fabricating the structure which provides a desired connection between the bodies of selected SOI FETS. The SOI body selective equilibration link is built in an area efficient manner by providing a thin silicon region made from the original silicon of the SOI substrate that is connected to the body electrode of two or more FETs. The thin silicon region is furthermore buried underneath a shallow isolation oxide, which advantageously blocks the source/drain implants from the thin silicon region.

The present invention further provides for obtaining a desired acceptable matching of threshold voltages in certain circuits, such as SRAM cells, differential amplifiers, sense amplifiers, etc., in which it is essential that the body voltages of the matched pairs be equal. The present invention provides the matching of threshold voltages in a compact and efficient way, wherein a minimum of silicon real estate is required. That is, the present invention is highly silicon area efficient. Such efficiency is very critical in the ability of obtain high density applications, such as SRAM cells.

The present invention is preferably for use in the linking of bodies of two n-type driver devices of SRAM cells and sense amplifiers. Although two or more body nodes of the n-type driver devices are tied together via the SOI body selective equilibration link according to the present invention, the nodes which are tied together are left to float, thus advantageously allowing the performance enhancement due to SOI body floating to be maintained, while overcoming the mismatch problems as discussed previously. That is, any threshold mismatch due to any possibility of different body potential is eliminated. The concept of the present invention can be applied to any SOI circuit including memory and logic to link the bodies of select ones of all the critical devices together so that the behavior of these devices are well controlled. The SOI body selective equilibration link may also be of a relatively high resistance without adversely affecting a performance of the circuit device.

The buried link path of the present invention is furthermore unique in that during the method of making the structure, a controlled silicon thickness removal is first performed in a location different from the location to be used for the link path. Such a controlled thickness removal in a location different from the location to be used for the link path is used as a monitor area, which is a much larger area in comparison to the area of the link path region. Thus, a much larger area is provided for use as an etch stop indicator during the etching step for the formation of the link path. The larger area enables the etching tool to more readily determine an etching endpoint and the etch process is more easily controlled. Once etching is achieved down to the isolation oxidation layer of the SOI substrate during the controlled thickness removal (or field oxide) area, the very small link path area will have a desired designed thickness. The buried SOI body selective equilibration link of the present invention improves device packing density. With the present invention, the minimal dimensions for the buried SOI body selective equilibration link achievable by etching is governed by lithographic resolution, for example, which may include 0.15 µm by deep UV lithography, 0.1 µm by x-ray lithography, and so on.

There has thus been shown an SOI body selective link method and apparatus which provides a methodology, structure and process for forming SOI body links, selectively between desired devices. Such a method and apparatus assure a rapid equilibrium of body potential and closely matched Vts in critical SOI circuits.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. For example, the SOI body selective link is equally applicable for a latch type sense amplifier used in any memory cell, such as SRAM, DRAM, or EPROM on SOI. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A silicon-on-insulator (SOI) structure comprising:
   an SOI wafer including a silicon layer having an original thickness dimension formed upon an isolation oxidation layer; and
   a floating pair of SOI field effect transistors (FETs) connected by a conductive SOI body link;
   said conductive SOI body link formed in the silicon layer of said SOI wafer adjacent the isolation of oxidation layer for selectively connecting desired pairs of FETs and for allowing a connected pair to float to an equal potential.

2. The silicon-on-insulator (SOI) structure of claim 1, wherein said SOI body selective link includes a desired thickness dimension having a shallow trench isolation region formed on a top surface thereof, wherein the thickness dimension of said SOI body selective link and a thickness dimension of the shallow trench isolation region together are on the order of the original thickness dimension of the silicon layer of said SOI wafer.

3. The silicon-on-insulator (SOI) structure of claim 1, wherein said SOI body selective link includes an equilibration link for enabling any threshold voltage mismatch in two cross-coupled SOI FETs caused by any possibility of different body potential to be eliminated and a behavior of the two cross-coupled SOI FETs to be well controlled.

4. The silicon-on-insulator (SOI) structure of claim 3, wherein said SOI body selective equilibration link selectively connects desired n-type bodies of n-type driver SOI FETs of an SRAM cell.

5. The silicon-on-insulator (SOI) structure of claim 3, wherein said SOI body selective equilibration link selectively connects desired n-type bodies of SOI NFETs of a sense amplifier.

6. The silicon-on-insulator (SOI) structure of claim 3, wherein said SOI body selective equilibration link selectively connects desired p-type bodies of SOI PFETs of an SRAM cell.

7. The silicon-on-insulator (SOI) structure of claim 3, wherein said SOI body selective equilibration link selectively connects desired p-type bodies of SOI PFETs of a sense amplifier.

8. The silicon-on-insulator (SOI) structure of claim 1, wherein said SOI body selective link includes a link utilized in an integrated logic circuit having SOI bodies for linking selected SOI bodies together such that a circuit timing is not adversely affected by body potential variations, wherein the particular linked bodies include bodies of critical devices on a critical path of the logic circuit for which any threshold voltage (Vt) change would undesirably affect a timing of the logic circuit.

9. A silicon-on-insulator (SOI) structure comprising:
an SOI wafer including a silicon layer having an original thickness dimension formed upon an isolation oxidation layer; and
a floating pair of SOI field effect transistors (FETs) connected by a conductive SOI body link;
said SOI body link formed in the silicon layer of said SOI wafer adjacent the isolation oxidation layer for selectively connecting desired pairs of SOI FETs and for allowing a connected pair to float to an equal potential, wherein said SOI body selective link includes a desired thickness dimension having a shallow trench isolation region formed on a top surface thereof, wherein the thickness dimension of said SOI body selective link and a thickness dimension of the shallow trench isolation region together are on the order of the original thickness dimension of the silicon layer of said SOI wafer, further wherein said SOI body selective link is an equilibration link for enabling any threshold voltage mismatch in two cross-coupled SOI FETs caused by any possibility of different body potential to be eliminated and an electrical behavior of the two cross-coupled SOI FETs to be well matched.

10. An integrated circuit including a silicon-on-insulator (SOI) structure comprising:
an SOI wafer including a silicon layer having an original thickness dimension formed upon an isolation oxidation layer; and
a floating pair of SOI field effect transistors (FETs) connected by a conductive SOI body link;
said conductive SOI body link formed in the silicon layer of said SOI wafer adjacent the isolation oxidation layer for selectively connecting desired pairs of SOI FETs and for allowing a connected pair to float to an equal potential.

11. The integrated circuit of claim 10, wherein said SOI body selective link includes a desired thickness dimension having a shallow trench isolation region formed on a top surface thereof, wherein the thickness dimension of said SOI body selective link and a thickness dimension of the shallow trench isolation region together are on the order of the original thickness dimension of the silicon layer of said SOI wafer.

12. The integrated circuit of claim 10, wherein said SOI body selective link includes an equilibration link for enabling any threshold voltage mismatch in two cross-coupled SOI FETs caused by any possibility of different body potential to be eliminated and a behavior of the two cross-coupled SOI FETs to be well controlled.

13. The integrated circuit of claim 12, wherein said SOI body selective equilibration link selectively connects desired n-type bodies of n-type driver SOI FETs of an SRAM cell.

14. The integrated circuit of claim 12, wherein said SOI body selective equilibration link selectively connects desired n-type bodies of SOI NFETs of a sense amplifier.

15. The integrated circuit of claim 12, wherein said SOI body selective equilibration link selectively connects desired p-type bodies of SOI PFETs of an SRAM cell.

16. The integrated circuit of claim 12, wherein said SOI body selective equilibration link selectively connects desired p-type bodies of SOI PFETs of a sense amplifier.

17. The integrated circuit of claim 10, wherein said SOI body selective link includes a link utilized in an integrated logic circuit having SOI bodies for linking selected SOI bodies together such that a circuit timing is not adversely affected by body potential variations, wherein the particular linked bodies include bodies of critical devices on a critical path of the logic circuit for which any threshold voltage (Vt) change would undesirably affect a timing of the logic circuit.

* * * * *